June 10, 1952 A. G. LAZZERY 2,600,119

VARIABLE TUNING SYSTEM

Filed March 31, 1950 2 SHEETS—SHEET 1

Inventor
Angelo G. Lazzery

By H. W. Newton
Attorney

June 10, 1952 A. G. LAZZERY 2,600,119
VARIABLE TUNING SYSTEM
Filed March 31, 1950 2 SHEETS—SHEET 2

Inventor
Angelo G. Lazzery
By
H. W. Newton
Attorney

Patented June 10, 1952

2,600,119

UNITED STATES PATENT OFFICE 2,600,119

VARIABLE TUNING SYSTEM

Angelo G. Lazzery, Oaklyn, N. J., assignor to Radio Corporation of America, a corporation of Delaware Application March 31, 1950, Serial No. 153,265

10 Claims. (Cl. 336—130)

This invention relates to radio and television tuning systems and the like. In particular the invention relates to a system for adjusting or variably tuning certain of the high frequency signal circuit elements of multiple band tuners and the like.

A variable tuning system embodying the invention is particularly adapted for use with a multiple-band turret-type tuning system such as disclosed in a copending patent application of D. Mackey for improvements in Band Changing Systems for High Frequency Signal Tuners and the Like, Ser. No. 101,965, filed June 29, 1949, and assigned to the same assignee as this application.

In the copending application referred to, a preferred tuner is disclosed having a series of rotatably selectable segments, each carrying circuit elements for use in a particular signal frequency band or channel. The segments are affixed to a drum type turret tuning structure which is rotatable by means of a tuning or band change control shaft. Circuit elements, including tuning coils or inductances, are preferably, but not necessarily printed or photo engraved on the outer surface of the segments which are in the form of planar insulating strips or forms.

It has been found that certain of the tuning coils or inductance elements of tuners of this type may require tuning adjustment in use, and accordingly it is a primary object of this invention to provide an improved system of the above type which readily provides simplified and improved means for variably adjusting or tuning certain of the high frequency circuit elements thereof.

Variable tuning adjustment of inductive circuit elements and the like, of tuning systems generally, has in the past, been accomplished more readily by the use of movable core elements or similar movable tuning adjustment means arranged to be variably adjustable in position with respect to the above type of circuit elements. However, in a system of the type hereinbefore referred to, wherein a planar strip or printed circuit reactance is used, the combination of a movable tuning element with the strip for variably tuning the system presents problems not associated with the use of tuning cores in conventional tuning reactances or coils. As a result tuning assemblies for these planar strip circuit elements have been expensive and complicated when used, and the cost of assembling the combined systems has been prohibitive.

Variable tuning cores may be moved in proximity with a tunable circuit element by means of a rotatable threaded carriage such as a screw or bolt. If such a device is used, however, the assembly process ordinarily will require at least one step wherein the screw must be threaded into the core by an operator thereby excessively increasing the overall tuner assembly costs. Furthermore, functional operation of such of device is not optimum since there may be a large amount of back lash in the movement of a core threaded on an ordinary commercial type screw. In tuners for radio and television equipment, a precise tuning control is not only desirable but essential and where the tuning element must be moved in both directions, back lash can not be tolerated.

Furthermore, when using a flat strip coil form, as described above, there is no restricted guiding channel such as in a hollow cylindrical type coil form or the like and it is necessary therefore to provide a positive contact surface between the coil form and the movable tuning element not necessary in the conventional tuning core systems.

It is therefore a further object of this invention, to provide an improved variable tuning element and system which utilizes a movable structure, while obviating the inherent inadequacies of movable structures, as heretofore provided, for tuning radio and television circuit elements.

It is a further object of the invention, to provide an inexpensive variable tuning assembly which is precisely adjustable without back lash, and which is adapted for use in a compact high frequency, multiple-band tuner of the type hereinbefore referred to.

It is a still further object of the invention to provide an improved tuning system which may be assembled rapidly and easily adjusted in use, and which may be manufactured at low cost.

In accordance with the present invention, there is provided in one specific embodiment, a high frequency tuning system comprising an essentially planar reactance or other circuit element mounted upon an insulated form and an associated movable tuning element for variably tuning the reactance by means of relative positioning between the tuning element and the reactance. The movable tuning element is mounted upon a rotatable carriage such as a screw or bolt which is resiliently supported between two spaced end supporting members. The tuning element thereby moves with rotation of the carriage to provide relative motion with respect to the reactance, which is mounted in a fixed position near the carriage. When the carriage rotates, the tuning element moves, thereby changing the electrical properties of the resistance.

It is a still further object of the invention to provide an improved variable tuning system having a plurality of tuning reactances of the above type which is adapted to the limited space requirements of a turret type tuner wherein a plurality of frequency bands are covered by a corresponding number of segmental elements.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figure 1:
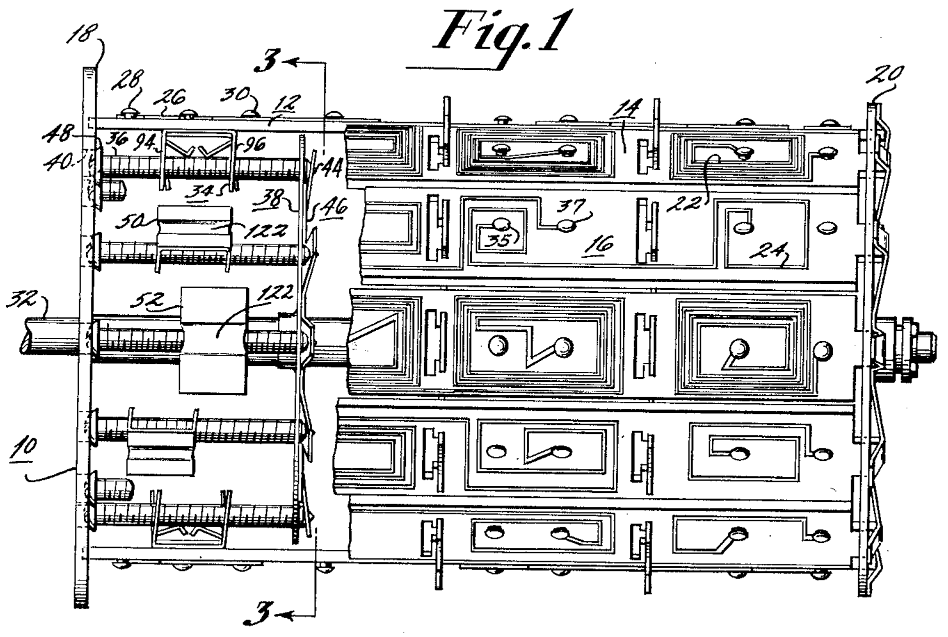
Figure 1 is a side view, with portions broken away to better show constructional details, of a rotary drum-type tuner embodying the invention.

Referring to the drawing in which like reference characters represent like parts throughout the respective views and referring in particular to Figure 1, there is shown a rotary drum type tuner 10 having a plurality of circuit elements mounted upon flat insulating segments or strips 12, 14 and 16. These and other similar segments or coil forms are detachably mounted around the circumference of the drum 10, as shown, between two end supporting members 18 and 20 in a manner described in my copending application for improvements in Television Printed Circuit R-F Tuners, Serial No. 102,367, filed June 30, 1949, and assigned to the same assignee as this application.

Circuit elements such as coils 22, 24 and 26 are affixed to the outer portions of the strips by printing, photo engraving or some like process, which is not a part of the present invention. External connections to these circuit elements are made by means of switch contacts formed by the heads of rivets or bolts 28, 30, 35, 37 connected in this particular embodiment to portions of the printed circuit coils 22, 24, 26 affixed to the insulated coil form strips.

Figures 4, 5:
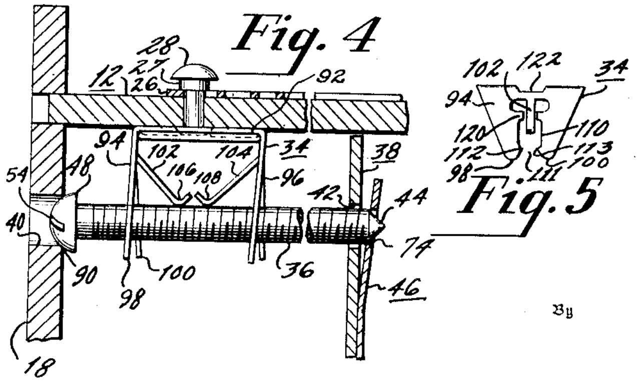
Figure 4 is a detailed side view, partly in section and on a greatly enlarged scale of a tuning element of the tuner of Figures 1 and 2, taken on line 4—4 of Figure 2, showing constructional details in accordance with the invention.
Figures 5 and 6 are end and plan views respectively, of a movable tuning element as shown in Figures 1 and 4 during construction in accordance with the invention, and substantially on the same scale as Figure 1.

A shoulder 27 of these rivets may extend above the coil 26 as shown more clearly in Figure 4, whereby the coil 26 representative of the others, for example, is firmly anchored to the strip 12 and a positive contact surface 28 is extended above any other circuit element portions on the strip 12 so that mating contact surfaces (not shown in the drawing) may register and make positive contact with the rivets without fouling any other portions of the rotatable drum periphery.

The rivet heads are used as switching contacts and it is readily seen that rotation of the drum by means of the control shaft 32 will successively present the rivet head switch contacts on one of these strips along a line at the drum periphery. By this means the rotary drum multiband tuner may be used for band switching between channels by presenting different circuit elements to the external circuit connection (not shown). Such a tuner is presently used, for example, in receiving apparatus covering several television signal bands, where each strip represents a particular channel within the bands.

It is often desirable, and necessary in some cases, to variably tune one or more of the circuit elements for each channel or signal band in aligning the circuits for proper signal response. In the present embodiment, the reactance 26 may be considered by way of example, as an inductive winding or coil associated with an oscillator circuit of a television or radio receiver for tuning in one frequency band. A movable tuning or core element 34 is provided for adjusting the reactance of the coil, thereby changing the oscillator frequency in adjusting the tuning of the receiver in the particular frequency band for which circuit element strip 12 is provided.

A rotatable tuning control or adjustment means 36 for the tuning element 34, may, in accordance with the invention, be provided by a simple bolt or screw which is mounted between a fixed end supporting member or plate 38 within the drum and one of the drum end members 18 for receiving and moving the tuning element 34. This movable tuning element 34 is in the form of a thin grooved plate of dielectric, magnetic, or conductive material such as sheet metal, for example, having two preferably integral leg or end portions extended therefrom at the ends to form a general U shaped structure which engages with and rides upon the threaded tuning control means 36, the end or leg portions being bifurcated or split and arranged to grip the screw thread as shown in Figures 1 and 4. The particular constructional features relating to the movable tuning elements will be more fully described hereinafter.

The rotatable tuning control means 36 itself is, in this embodiment, journaled to rotate in apertures 40 and 42 and provided in the supporting members 18 and 38. One portion or tip 44 of the threaded element or screw 36 extends through the aperture 42 in one supporting member 38 and into contact with a leaf spring 46 which is provided to effect a thrust force along the axis of the screw, thereby biasing the screw axially to seat and hold the rounded head 48 of the screw in engagement with the aperture 40 in the opposite end supporting member 18. The aperture 40 has a diameter smaller than the major diameter of the round head 48, thereby functioning as a socket for the screw head 48.

Tuning adjustment of the variable reactance may be accomplished by rotating the screw by screw driver means or the like through the aperture 40, thereby adjusting the relative position of the tuning element 34 with respect to the circuit element 26. It is noted that similar movable tuning core elements 50, 52 may be used with each of the coil form strips shown around the periphery of the drum tuner 10.

Figure 2:
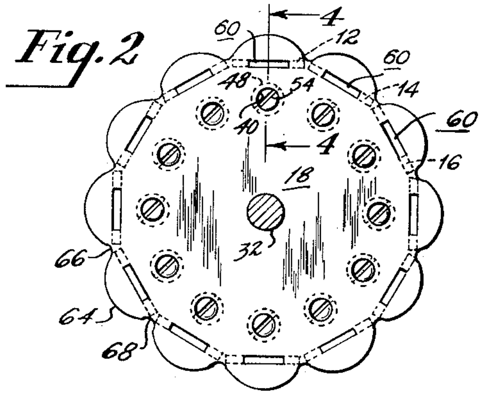
Figure 2 is an end view of the tuner shown in Figure 1, on a reduced scale, showing further features of the invention.

Figure 2 clearly shows a screw driver slot 54 in the rounded screw head 48 as seen through the aperture 40 in the end supporting member 18 and the arrangement of similar elements for the other tuning bands. The coil forms 12, 14 and 16 and others are also shown being firmly mounted in a plane parallel to the axis of the threaded tuning control means 36. One end of each of the strips 12, 14, 16 is affixed to the end member 18 by having a reduced end portion 60 extending through apertures in the end supporting member 18 as indicated.

The periphery 64 of the end supporting member 18 is provided with notches for engaging successively with a fixed ratcheting member (not shown) which registers with the notches 66 and 68, for example, in the edge 64 to stop in succession each particular selected circuit element strip 12 in a fixed position corresponding to the switch contact line along the periphery of the drum structure. This ratcheting feature not being a part of the present invention, is therefore not further described.

Figure 3:
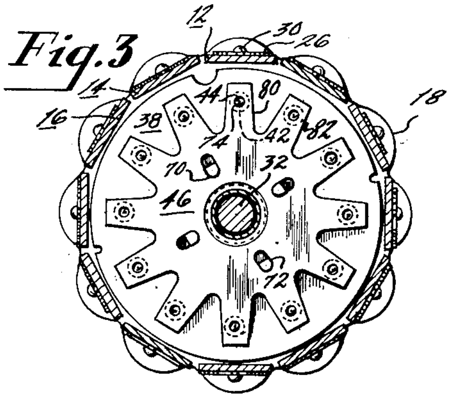
Figure 3 is a cross-sectional view of the tuner of Figure 1, on the same reduced scale as Figure 2, taken on section line 3—3 of Figure 1, to show the interior structure of the tuner as provided in accordance with the invention.

Referring now to Figure 3, there is shown the flat octopus shaped leaf spring 46 affixed to the support member 38 by means of clip fasteners 70, 72 or the like. A small aperture 74 is made in each of the extending arms 80, 82 of the spring to engage the tip portion 44 of the threaded tuning control member or screw 36 extending through the aperture 42 of the supporting member 38. This provides a thrust force along the tuning control member or screw axis thereby urging a portion of the round head 48 into the aperture or socket 40 located in the opposite supporting member 18.

Figure 4 shows more clearly the functional advantage of the thrust action of the spring 46 upon the tip 44 of the threaded member 36. The aperture socket 40 has a diameter smaller than the major diameter of the rounded head 48 so that the threaded body of the member 36 may be held between the apertures 40 and 42. With the head 48 seated in the inner rim of the aperture 40 of support member 18, the screw may be rotated in place without axial movement. The aperture 42 in the opposite end supporting member 38 is made larger than the major diameter of the threaded body of the rotary tuning control member. The tuning control member or screw 36 may therefore readily be snapped into frictional engagement with the end support member 18 and the leaf spring 46 by a single motion and need not be threaded into any of the apertures. Expensive tuning control mounting structure need not therefore be provided, but simply a pair of end supporting members 18 and 38 with a cooperating leaf thrust spring 46.

The movable tuning element or plate 34 has a tuning face 92 constructed to move laterally along the carriage and in contact with the insulated coil form 12. The face 92 preferably has a contour substantially congruent with that of the coil form, being in this particular embodiment a flat or planar strip, whereby a greater tuning effect will be possible because of a greater tuning area disposable near the variable reactance 26.

A pair of leg members 94, 96 extend from and substantially normal to the tuning face 92 and a pair of bifurcated fingers 98 and 100 are located at the extremities of each leg as hereinbefore noted. Two resilient spring members 102, 104 are integrally connected to each of the leg members 94 and 96 and bent or formed therefrom inwardly to have projecting portions 106 and 108. These portions are curved to smoothly ride on several threads of the threaded body 36 of the rotary carriage and they function thereby to urge or bias the tuning face 92 away from the axis of the carriage and into firm contact with the insulated coil form 12 which is fixed in a plane parallel to the carriage axis and removed therefrom. The curved portions 106 and 108 of the springs 102 and 104 have a radius of curvature large enough to prevent any binding which might be caused by riding between or catching on the threads.

A detailed construction of the fingers 98 and 100 is shown in Figure 5. A collar 110 formed by and between the fingers has a throat opening 111 formed by restrictions 112, 113 on the outer ends of the fingers 98 and 100. This arrangement permits the legs 94 and 96 of the tuning element 34 to be forced down upon the threaded body of the screw 36 thereby resiliently spreading the throat 111, which has a width smaller than the root diameter of the threaded body of the screw 36, to straddle the threaded body and allow the collar 110 to engage the threads on the rotatable tuning control means. The throat 111 also retains the tuning element upon the tuning control means against the bias of the spring member 102 which is caused to ride upon the top of the threaded body of the screw 36 of the tuning control means, thereby tending to force the tuning surface 92 upward (as shown in the drawing) so that the throat 111 will engage the bottom of the threaded tuning control means.

As shown in the drawing, a restricted opening 120 is provided at the top of the collar 110 so that the tuning element 34 can not be forced down upon the tuning control means 36 to a point exceeding the elastic limit of the spring element 102. The collar 110 has a diameter slightly greater than the root diameter of the tuning control means threads so that a free vertical motion of the tuning element 34 is possible, without binding or otherwise overcoming the spring biasing action.

Figures 7, 8, 9, 10, 13:
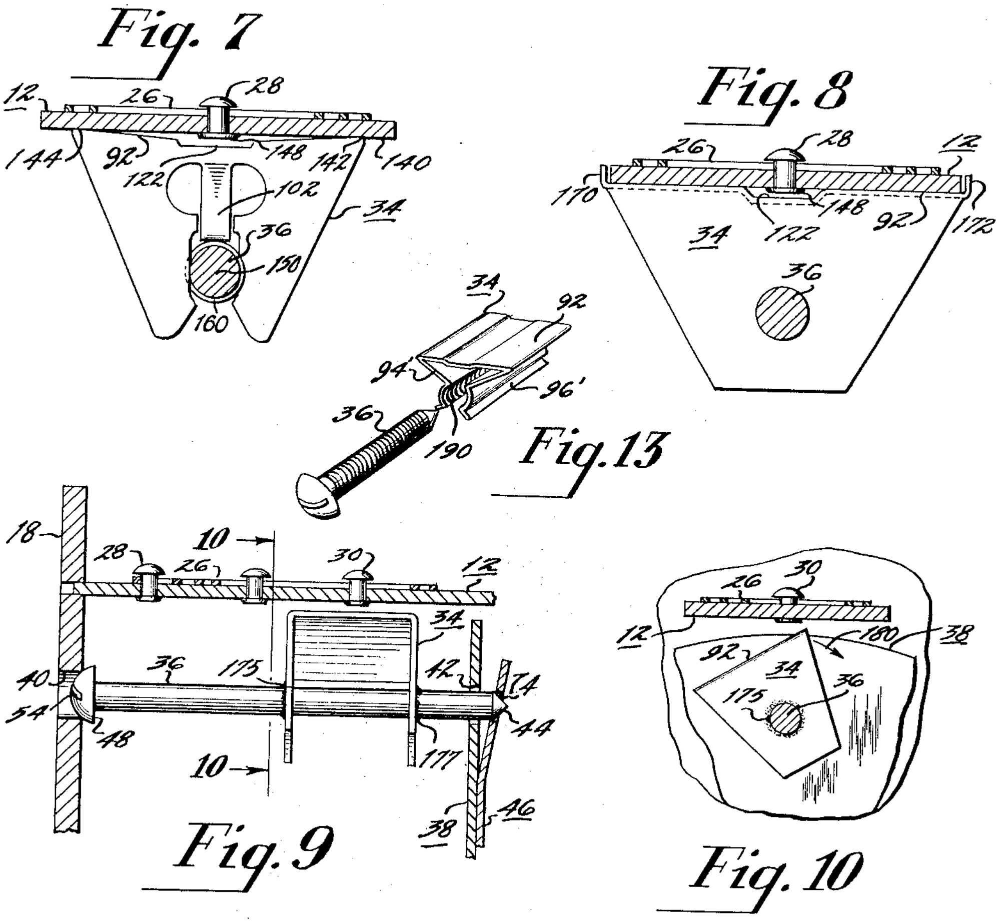
Figures 7 and 8 are end views, partly in section and on a greatly enlarged scale, of the tuning element of Figure 4, showing detailed modifications in accordance with the invention.
Figure 9 is a side view, partly in section and on substantially the same enlarged scale, of a modification of the embodiment of the invention shown in Figure 4.
Figure 10 is a partially sectional end view of the embodiment shown in Figure 9, taken on the line 10—10 of Figure 9, and on the same scale.

A longitudinal groove 122 is provided in the face of the tuning element 34 so that the portions of the rivet 28 extending through the coil form 12 will not touch or make electrical contact with the tuning surface 34, as will be seen clearly from a consideration of the end view of a slightly modified form shown in Figure 7.

Referring again to Figure 4, the fingers 98 and 100 are shown bent in opposite directions along the axis of the threaded member 36. In this manner the pseudo-thread arrangement formed by the collar 110 and throat 111 between the bifurcated fingers 98 and 100 will straddle the threaded screw body 36 and the fingers 98 and 100, which are bent in opposite directions along the axis of the threaded screw body 36, will resiliently engage opposing faces of the screw upon opposite sides of said member with a scissorlike action. In this manner, back lash is prevented, since upon rotation of the threaded member in either direction the finger on each leg of the movable tuning element will be in positive contact in both opposing directions with the threads of the screw member 36. Because of this contact in both directions, an instantaneous torque is transmitted from the screw member 36 to the tuning element 34 in either direction of rotation and no lost motion is required to move the screw member before the tuning element begins its motion.

Figure 6:
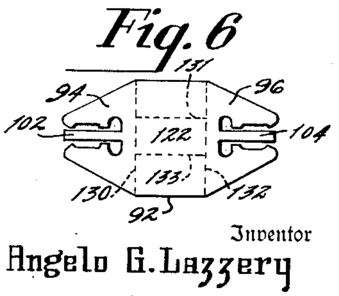

The entire movable tuning element may be made from a thin flat sheet preferably of a resilient material such as aluminum, brass or copper which is a good electrical conductor. Similarly a ferro-magnetic material, or any other material either conductive, magnetic or dielectric, having characteristics such that the electrical properties of the circuit element 26 are affected by the relative positioning of the material in physical proximity therewith, may be used. The tuning element may be stamped by any of the many known processes from a large sheet in the flat form shown in Figure 6 and simply stamped or pressed into final form. When initially stamped in this flat form, the spring members 102 and 104 are an integral part of the legs 94 and 96 and they extend outwardly on opposite sides of the tuning face 92 in the same plane. In the second pressing step the legs are bent away from the tuning face 92 along the dotted lines 130, 132 (as shown in the drawing) in a direction essentially perpendicular from the tuning face 92, and in the same operation the groove 122 may be impressed into the tuning face as shown by the dotted lines 131 and 133 and the springs 102 and 104 properly shaped.

It is clear from the foregoing discussion of the invention that there is provided a cheaply manufactured movable tuning system which has many functional advantages. In particular, it is to be noted that by means of the particular pseudo-thread clip arrangement used herein the tuning element can be snapped upon the threaded tuning control member 36 during the assembly operation with one motion in the approximate position which will be ultimately desired for proper tuning within each channel. There is therefore eliminated in the assembly operation the several motions and the relatively large amount of time involved in threading a movable tuning element upon a threaded member. Cost of the assembled tuning units involving, as shown, a plurality of such tuning means, is greatly reduced because of the simple constructional characteristics of the separate elements and because the assembly consists only of two simple operations performed by merely snapping the threaded control members and the movable tuning members into their proper positions.

The planar coil form 12 may not necessarily be an entirely flat or machined surface and may therefore be subject to certain irregularities along the bottom face 140 where the movable tuning element 34 rides. This may cause mistuning of the system, in some cases. Accordingly the tuning face 92 of the movable tuning element 36 may be dished toward the centermost portion to form a small angle between the tuning face and the coil form surface 140 as shown in Figure 7. A smaller contact surface is thereby provided to cause mistuning and the resulting line contact surface will minimize any irregularities of the coil form segment 12. In this particular arrangement, the movable tuning core element makes contact with the coil form 12 only along the line at the outer two extremities 142, 144 of the tuning face 92. This particular view also shows clearly how the groove 122 of the tuning face prevents contact of the lower end or head 148 of the rivet 28 with any part of the tuning surface 92.

From a further consideration of this view, it is seen that the spring 102 rides upon the top surface of the threaded body 36 thereby urging the tuning face 92 away from the axis 150 of the threaded body and into firm contact with the bottom surface 140 of the coil form 12. It is also seen that the collar 110 has a diameter which is slightly larger than that of the groove or root diameter of the threaded screw 36. This permits the fingers 98 and 100 to fit between the threads by their scissor-like action. The bifurcated fingers thereby engage opposing faces of the threads by resiliently pressing against the forward thread surface 160 as seen in the figure while at the same time resiliently contacting the rear face of the thread 160 on the screw body 36. This scissor-like action as hereinbefore described prevents backlash of the tuning element 34 on the screw body 36 when the direction of carriage rotation is reversed.

In some cases there might be a tendency for the movable tuning element 34 to rotate with the screw 36 upon rotation thereof. If such rotation is undesirable as in this shown embodiment where only a longitudinal motion of the tuning face is desired, additional flanges 170, 172 may be formed at opposite edges of the tuning face 92 to engage the opposite sides of the coil form 12 as shown in Figure 8. These flanges 170, 172 are bent perpendicular to the tuning face 92 in the direction of the coil form 12 and thereby in cooperation with the tuning face 92 they form a channel which snugly fits over the coil form 12, permitting only the desired longitudinal motion of the tuning element, and eliminating any tendency for the tuning surface 92 to rotate with the screw 36.

In Figure 9 there is shown a tuning arrangement similar to that described, but which has the movable tuning element 34 force fitted or otherwise firmly fixed to the body of an unthreaded screw or bolt 36 by means of staked sleeves 175 and 177 or the like. The tuning element 34 is therefore rotatable with the unthreaded screw body 36 as more clearly shown in Figure 10. If the tuning element 34 is rotated in the direction of the arrow 180 (as shown in the drawing) a greater portion of the tuning surface 92 will be presented in proximity with the circuit element 26 thereby changing its electrical properties and tuning the circuit in a manner similar to that already described.

Figure 11:
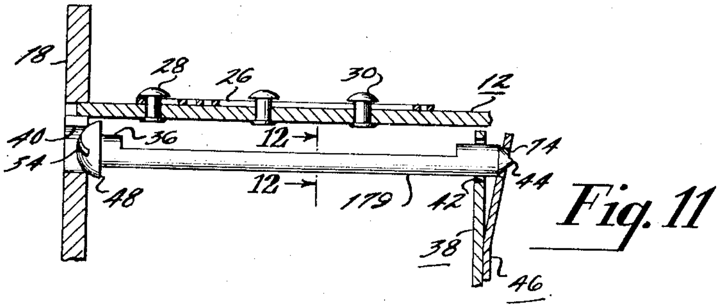
Figure 11 is a side view, partly in section and on substantially the same scale, of a further modification of the embodiment of the invention shown in Figure 4.

Figure 11 shows a similar arrangement wherein the tuning surface is actually an eccentrically mounted portion 179 of the rotating screw or bolt 36 itself. In this embodiment the rotating carriage is shown with the eccentic portion 179 being a portion of cylindrical rod. The portion may be formed by having the body of the rod milled to a semi-circular cross section.

Figure 12:
Figure 12 is a cross-sectional view of a portion of the embodiment shown in Figure 11 taken on the line 12—12; and, Figure 13 is a perspective view showing a further detailed modification of a movable tuning element portion of the embodiment of the invention shown in Figures 1 and 4.

As shown in Figure 12, rotation of the modified carriage in this embodiment of the invention will similarly cause the eccentrically rotatable portion 179 of the metallic body of the screw 36 to be moved relatively to the surface of the circuit element 21 thereby changing its electrical properties. It is to be recognized that the milled body of the screw 36 might be any other type of eccentrically mounted tuning face which is rotatable between the end suporting members 18, 38.

A further embodiment of the movable tuning element 34 is shown in Figure 13 wherein the legs are bent parallel to the carriage axis rather than perpendicular. The threaded body of the screw 36 will then engage threads 190 stamped or otherwise formed in the legs 94 and 96 and along the entire length of the tuning face 92. This particular embodiment has the advantages of being stiffer, and of riding longitudinally along the rotatable carriage without any great tendency to jump up and down. It is to be recognized that even further modifications of the tuning element may be made in view of the foregoing description, but that they are to be included in the present invention.

There has thus been described a variable tuning reactance and system which provides precise tuning of a high frequency circuit element, yet which is inexpensive to manufacture and which may be easily assembled. The described arrangement comprises a U-shaped movable tuning element stamped from a flat sheet of a resilient, electrically conducting material, or the like, and having a threaded clip, which is in one embodiment a unique pseudo-thread design, for mounting the tuning element on and effecting its movement along or about a rotatable tuning control means such as a screw or bolt. Further features have been described, such as a particular carriage supporting arrangement whereby the carriage may be readily snapped into place. The invention is not to be limited to a system using a copper or brass tuning element or circuit elements mounted on a planar form, since one skilled in the art may immediately recognize that the use of other materials or of a curved or nonplanar form in conjunction with the particular tuning system would not constitute a departure from the invention.

It is thereby recognized that although there is hereinbefore given a complete description of the invention, its construction and operation, there shall be certain modifications suggested to those skilled in the art which will not necessarily depart from the spirit or scope of the invention.

What is claimed is:

1. A variable tuning element and system comprising in combination, a pair of end supporting members arranged in fixed spaced relationship, each member having an aperture therein, said apertures being arranged along a fixed axis, a rotatable longitudinal tuning control means having a length slightly greater than said fixed space, having a rounded head larger than a first of said apertures corresponding thereto and having a body smaller than the second of said apertures, said tuning control means being mounted between said supporting members, a leaf spring member arranged adjacent to said second aperture to socket a part of said rounded head into said first corresponding aperture by a thrust contact with a portion of said tuning control means external to said end supporting members, a fixed variably tunable circuit element supported on an insulated form mounted substantially parallel to said axis and removed therefrom, and a movable tuning element mounted upon said rotatable tuning control means being thereby relatively movable with respect to said circuit element for variable tuning thereof.

2. A tuning system as defined in claim 1, wherein said body is threaded and wherein said movable tuning element comprises a tuning plate, two supporting legs for said tuning face, a pair of spring members integral with said supporting legs and having a portion spaced therefrom to ride on said threaded body and urge said tuning face away from the body and into contact with said insulated form, and two bifurcated fingers extending from each of said legs and forming therebetween a collar for said body having a throat of a dimension smaller than the root diameter of said threaded body, whereby said fingers may be sprung to straddle said threaded body, said fingers being bent in opposite directions along said axis to thereby resiliently engage opposite faces of threads on said body and prevent back lash in said tuning system when the direction of rotation of said tuning control means is changed.

3. A tuning system as defined in claim 2, wherein said tuning plate has outwardly extending substantially perpendicular integral flanges for engaging said insulated form to prevent rotation of said movable tuning element with rotation of said tuning control means.

4. A tuning ssytem as defined in claim 2 wherein said tuning plate is dished in a direction parallel to said axis and toward the centermost portions of the tuning plate, so that contact is made by the tuning plate with said insulated form only along lines located at the outer extremities of said face and parallel to said axis.

5. A tuning system as defined in claim 1, wherein said movable tuning element is an affixed portion of said rotatable tuning control means rotating therewith, being eccentrically mounted and extending away from said axis, thereby being rotatable in immediate proximity to said insulated form to variably tune said circuit element by variably changing the distances between the surface portion of said element and said fixed circuit element upon rotation of said tuning control means.

6. A movable tuning element for varying the electrical characteristics of a tunable circuit element and for use as a rider on an axial rotatable threaded tuning control means mounted near said circuit element comprising in combination, a tuning surface of a material affecting the electrical properties of said circuit element, a pair of supporting legs for said tuning surface, a pair of bifurcated fingers on each of said legs forming a collar for fitting around said rotatable threaded tuning control means and having a throat of a dimension smaller than the root diameter of said threaded tuning control means, whereby said fingers may be sprung to straddle said tuning control means and engage the threads thereon, said fingers being in the form of a thin sheet portion substantially perpendicular to the axis of said tuning control means, whereby said collar engages single threads on opposite sides of said tuning control means, said fingers further being sprung in opposite directions along the axis of said tuning control means so that they may resiliently engage opposing faces of the threads on said tuning control means.

7. A tuning element as defined in claim 6, having spring members integral with each of said legs and bent inwardly for riding upon said tuning control means thereby to urge said tuning surface away from said tuning control means and into physical proximity with said circuit element.

8. A variable tuning device comprising in combination a longitudinal rotatable threaded tuning control means, an electrically responsive circuit element, means for supporting said tuning control means, and said device in substantially parallel relationship and a movable tuning element of a material for variably tuning said circuit element engaging threads on said tuning control means so that rotation of said tuning control means provides relative motion between said tuning element and said circuit element, said tuning element comprising a U-shaped metallic sheet having bifurcated fingers in the form of a pseudo-thread with said fingers being sprung in opposite directions along the axis of the tuning control means for frictionally engaging opposite faces the threads on said tuning control means thereby preventing backlash.

9. A variable tuning structure comprising in combination, a pair of disc shaped end supporting members arranged in fixed space relationship and having a pair of apertures therein arranged to fall along an axis extending between said end supporting members and substantially normal thereto, a rotatable longitudinal tuning control means journaled between said apertures, and a tunable circuit element supported between said members in proximity to said tuning control means and along an axis substantially parallel therewith, said tuning control means having an eccentrically rotatable portion of a material affecting the electrical properties of said circuit element so that rotation of said tuning control means will vary the distance between said eccentrically rotatable portion and said circuit element, thereby changing the electrical properties thereof to variably tune said circuit element.

10. A variable tuning system comprising in combination, a longitudinal rotatable tuning control means frictionally mounted between a pair of end supporting members in a fixed space relationship, a flat insulated strip mounted in a plane parallel to said tuning control means, a tuning surface having a substantially flattened face movable in contact with and along said strip by rotation of said tuning control means, means for preventing backlash of said tuning surface upon rotation of said control means, and an essentially planar tunable circuit element affixed to said strip whereby motion of said tuning surface will variably tune said circuit element with a high degress of precision.

ANGELO G. LAZZERY.

REFERENCES CITED

The following references are of record in the file of this patent:

UNITED STATES PATENTS

| Number | Name | Date |
|---|---|---|
| 2,379,457 | Ricker | July 3, 1945 |
| 2,448,190 | Olesky | Aug. 31, 1948 |
| 2,541,897 | Wadsworth | Feb. 13, 1951 |

FOREIGN PATENTS

| Number | Country | Date |
|---|---|---|
| 615,106 | Great Britain | Jan. 3, 1949 |